US008664690B1

(12) United States Patent
Chen et al.

(10) Patent No.: US 8,664,690 B1
(45) Date of Patent: Mar. 4, 2014

(54) BI-DIRECTIONAL TRIODE THYRISTOR FOR HIGH VOLTAGE ELECTROSTATIC DISCHARGE PROTECTION

(71) Applicant: Macronix International Co., Ltd., Hsin-chu (TW)

(72) Inventors: Hsin-Liang Chen, Taipei (TW); Shuo-Lun Tu, Hsinchu (TW); Wing-Chor Chan, Hsinchu (TW); Shyi-Yuan Wu, Hsin-Chu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 13/677,921

(22) Filed: Nov. 15, 2012

(51) Int. Cl.
*H01L 29/74* (2006.01)
*H01L 29/747* (2006.01)
*H01L 29/744* (2006.01)

(52) U.S. Cl.
USPC ........... 257/107; 257/109; 257/110; 257/119; 257/E29.036; 257/E29.215; 257/E21.392; 438/133; 438/139; 438/140

(58) Field of Classification Search
USPC ................. 257/107, 109–110, 111–112, 119, 257/120–131, 133, 137, 139–149, 152–153, 257/162–167, E27.052, E27.079, E29.115, 257/E29.196, E29.211, E29.03, 6, E29.215, 257/E21.392; 438/133–140
See application file for complete search history.

(56) References Cited

U.S. PATENT DOCUMENTS

| 5,204,541 | A | * | 4/1993 | Smayling et al. | ............. 257/138 |
| 5,608,235 | A | * | 3/1997 | Pezzani | .......................... 257/119 |
| 5,808,326 | A | * | 9/1998 | Bernier et al. | ................ 257/109 |
| 5,856,214 | A | * | 1/1999 | Yu | ................................. 438/133 |
| 6,323,523 | B1 | * | 11/2001 | Lee et al. | ....................... 257/355 |
| 6,479,841 | B1 | * | 11/2002 | Simonnet | ....................... 257/146 |
| 6,541,801 | B1 | * | 4/2003 | Vashchenko et al. | ......... 257/119 |
| 6,552,370 | B2 | * | 4/2003 | Pezzani | ......................... 257/107 |
| 6,580,142 | B1 | * | 6/2003 | Pezzani | ......................... 257/500 |
| 6,583,496 | B2 | * | 6/2003 | Galtie et al. | .................. 257/601 |
| 6,914,271 | B2 | * | 7/2005 | Menard | ......................... 257/119 |
| 7,479,414 | B2 | * | 1/2009 | Salcedo et al. | ................ 438/133 |
| 7,719,026 | B2 | * | 5/2010 | Lou et al. | ....................... 257/173 |
| 8,283,695 | B2 | * | 10/2012 | Salcedo et al. | ................ 257/119 |
| 8,513,774 | B2 | * | 8/2013 | Chen et al. | .................... 257/579 |
| 8,519,434 | B2 | * | 8/2013 | Chen et al. | .................... 257/173 |
| 2005/0082618 | A1 | * | 4/2005 | Wu et al. | ....................... 257/355 |
| 2007/0007545 | A1 | * | 1/2007 | Salcedo et al. | ................ 257/127 |
| 2007/0052030 | A1 | * | 3/2007 | Huang et al. | .................. 257/355 |
| 2008/0012044 | A1 | * | 1/2008 | Salcedo et al. | ................ 257/173 |
| 2008/0044955 | A1 | * | 2/2008 | Salcedo et al. | ................ 438/140 |
| 2008/0259511 | A1 | * | 10/2008 | Worley | ........................... 361/56 |
| 2010/0320501 | A1 | * | 12/2010 | Gendron et al. | .............. 257/173 |

(Continued)

*Primary Examiner* — Laura Menz
*Assistant Examiner* — Maliheh Malek
(74) *Attorney, Agent, or Firm* — Alston & Bird LLP

(57) ABSTRACT

A bi-directional triode thyristor (TRIAC) device for high voltage electrostatic discharge (ESD) protection may include a substrate, an N+ doped buried layer, an N-type well region and two P-type well regions. The N+ doped buried layer may be disposed proximate to the substrate. The N-type well region may encompass the two P-type well regions such that a portion of the N-type well region is interposed between the two P-type well regions. The P-type well regions may be disposed proximate to the N+ doped buried layer and comprise one or more N+ doped plates and one or more P+ doped plates. The portion of the N-type well region that is interposed between the two P-type well regions may comprise one or more P-type portions, such as a P+ doped plate or a P-type implant.

19 Claims, 15 Drawing Sheets

(56) References Cited

U.S. PATENT DOCUMENTS

| | | | |
|---|---|---|---|
| 2011/0186909 A1* | 8/2011 | Tsai et al. | 257/173 |
| 2012/0086080 A1* | 4/2012 | Chen et al. | 257/355 |
| 2012/0205714 A1* | 8/2012 | Salcedo et al. | 257/140 |
| 2012/0241861 A1* | 9/2012 | Chen et al. | 257/339 |
| 2012/0241900 A1* | 9/2012 | Chen et al. | 257/503 |
| 2012/0248574 A1* | 10/2012 | Chen et al. | 257/569 |
| 2012/0286362 A1* | 11/2012 | Chan et al. | 257/337 |
| 2013/0049067 A1* | 2/2013 | Chen et al. | 257/173 |
| 2013/0214821 A1* | 8/2013 | Chen et al. | 327/109 |

* cited by examiner

Conventional TRIAC (Prior Art)

BI-DIRECTIONAL TRIODE THYRISTOR FOR HIGH VOLTAGE ELECTROSTATIC DISCHARGE PROTECTION

TECHNOLOGICAL FIELD

Embodiments of the present invention generally relate to semiconductor devices and, more particularly, relate to a bi-directional triode thyristor for high voltage electrostatic discharge (ESD) protection.

BACKGROUND

There is currently an ongoing drive toward the downscaling of device dimensions in virtually all aspects of electronic device manufacture. Smaller electronic devices tend to be more popular than larger, more bulky devices when both devices have substantially equivalent capabilities. Accordingly, being able to fabricate smaller components would clearly tend to facilitate the production of smaller devices that incorporate those components. However, many modern electronic devices require electronic circuitry to perform both actuation functions (e.g., switching devices) and data processing or other decision making functions. The use of low voltage complementary metal-oxide-semiconductor (CMOS) technologies for these dual functions may not always be practical. Thus, high voltage (or high power) devices have also been developed to handle many applications where low voltage operation is not practical.

The electrostatic discharge (ESD) performance of typical high voltage devices often depends on the total width and surface or lateral rules of the corresponding devices. Thus, ESD performance may typically be more critical for smaller devices. High voltage devices typically have characteristics that include a low on-state resistance (Rdson), a high breakdown voltage and a low holding voltage. The low on-state resistance may tend to make an ESD current more likely to concentrate on the surface or the drain edge of a device during an ESD event. High current and high electric fields may cause the physical destruction at a surface junction region of such a device. Based on the typical requirement for a low on-state resistance, the surface or lateral rules likely cannot be increased. Thus, ESD protection may be a challenge.

The high breakdown voltage characteristic of high voltage devices typically means that the breakdown voltage is higher than the operating voltage, and the trigger voltage (Vt1) is higher than the breakdown voltage. Accordingly, during an ESD event, the internal circuitry of the high voltage device may be at risk of damage before the high voltage device turns on for ESD protection. The low holding voltage characteristic of high voltage devices also leaves open the possibility that unwanted noise associated with a power-on peak voltage or a surge voltage may be triggered or that a latch-up may occur during normal operation. High voltage devices may also experience the field plate effect due to the fact that electric field distribution may be sensitive to routing so that ESD current may be likely to concentrate at the surface or drain edge during an ESD event.

To improve high voltage device performance with respect to ESD events, one technique that has been implemented involves the additional use of masks and other processes to create a larger sized diode within bipolar junction transistor (BJT) components and/or increasing the surface or lateral rules for MOS transistors. Silicone controlled rectifiers (SCRs) have also been developed to protect circuitry during ESD events. However, while the low holding voltage of SCRs means they may perform well during ESD events, this characteristic also increases the occurrence of latch-up during normal operation.

Motor driver circuits may be particularly troublesome to protect from ESD events using current solutions. This is because when a motor is switched off, it may continue spinning for some time, thus acting as an inductor which feeds back a high negative voltage. If the motor driver circuitry were to include a PMOS, the parasitic forward bias diode of the PMOS may be turned on by this negative feedback voltage, potentially causing latch-up issues and/or other irregular circuit operation.

Accordingly, it may be desirable to develop an improved structure for providing ESD protection and, in particular, for providing bi-directional ESD protection.

BRIEF SUMMARY OF EXEMPLARY EMBODIMENTS

Some example embodiments are therefore directed to a bi-directional triode thyristor (also known as a "TRIAC" (TRIode for Alternating Current)) for high voltage electrostatic discharge (ESD) protection. In some cases, the ESD protection may be provided at least in part based on modifications to a BCD (Bipolar Complimentary metal-oxide semiconductor (BiCMOS) Diffusion metal-oxide semiconductor (DMOS)) process that may involve an epitaxial process.

In one exemplary embodiment, a TRIAC is provided ("exemplary" as used herein referring to "serving as an example, instance or illustration") which may include a p-type substrate, an N+ doped buried layer, an N-type well region and two P-type well regions. The N+ doped buried layer may be disposed adjacent to the substrate. The N-type well region may be disposed adjacent to the N+ doped buried layer and encompassing the first and second P-type well regions such that a middle portion of the N-type well region is interposed between the first and second P-type well regions. The P-type well regions may be disposed adjacent to the N+ doped buried layer and each may respectively comprise one or more N+ doped plates and one or more P+ doped plates. The middle portion of the N-type well region may comprise at least one P-type portion.

According to a further embodiment, the P-type well regions comprise three N+ doped plates, two P+ doped plates, and two gate structures. For each P-type well, the three N+ doped plates, two P+ doped plates, and two gate structures may be configured such that a first P+ doped plate is disposed adjacent to a first N+ doped plate, a first gate structure is interposed between the first and a second N+ doped plate, a second gate structure is interposed between the second and a third N+ doped plate, and a second P+ doped plate is disposed adjacent to the third N+ doped plate.

In another exemplary embodiment, a circuit is provided which comprises a TRIAC high voltage ESD protection element. The TRIAC high voltage ESD protection element comprises a p-type substrate, an N+ doped buried layer, an N-type well region and two P-type well regions. The N+ doped buried layer may be disposed adjacent to the substrate. The N-type well region may be disposed adjacent to the N+ doped buried layer and encompassing the first and second P-type well regions such that a portion of the N-type well region is interposed between the first and second P-type well regions. The middle portion of the N-type well region may comprise at least one P-type portion. The P-type well regions may be disposed adjacent to the N+ doped buried layer and each may respectively comprise one or more N+ doped plates and one or more P+ doped plates. The P-type well regions may comprise three N+ doped plates, two P+ doped plates, and two gate structures. For each P-type well, the three N+ doped plates, two P+ doped plates, and two gate structures may be configured such that a first P+ doped plate is disposed adjacent to a first N+ doped plate, a first gate structure is interposed between the first and a second N+ doped plate, a second gate structure is interposed between the second and a third N+ doped plate, and a second P+ doped plate is disposed adjacent to the third N+ doped plate.

According to yet another exemplary embodiment, a semiconductor device is provided which comprises a first high voltage thyristor and a second high voltage thyristor, the first and second thyristors sharing a common N-type well region.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION

Some example embodiments of the present invention will now be described more fully hereinafter with reference to the accompanying drawings, in which some, but not all embodiments of the invention are shown. Indeed, various example embodiments of the invention may be embodied in many different forms and should not be construed as limited to the example embodiments set forth herein; rather, these example embodiments are provided so that this disclosure will satisfy applicable legal requirements.

Some example embodiments of the present invention may provide a bi-directional triode thyristor (also known as a "TRIAC" (TRIode for Alternating Current)) that may, for example, be used for bi-directional high voltage ESD protection, e.g., protection for positive and negative voltage ESD. The TRIAC of example embodiments may combine two high voltage thyristors into one ESD protection device, thus providing a structure which may, according to example embodiments, have a total area smaller than a diode—BJT and MOS, while providing similar ESD performance in two directions. Example embodiments may also have a breakdown voltage that is near the high voltage device operation voltage and a trigger voltage that is lower than the high voltage device breakdown voltage. Furthermore, a relatively high holding voltage may be provided to more easily avoid latch-up occurrence than with a conventional silicon controlled rectifier (SCR). Example embodiments may, for example, provide flexibility by allowing various electrical characteristics to be adjusted during manufacturing. For example, breakdown voltage and trigger voltage to be adjusted by adjusting the length of one or more poly field plates disposed adjacent to the field oxide (FOX) portions and/or holding voltage may be adjusted by adjusting the width of the N-type well. Embodiments of the present invention may also be configured for early turn-on by providing an additional bias at the gate or the poly of the multi-emitter structure.

Figure 2A:
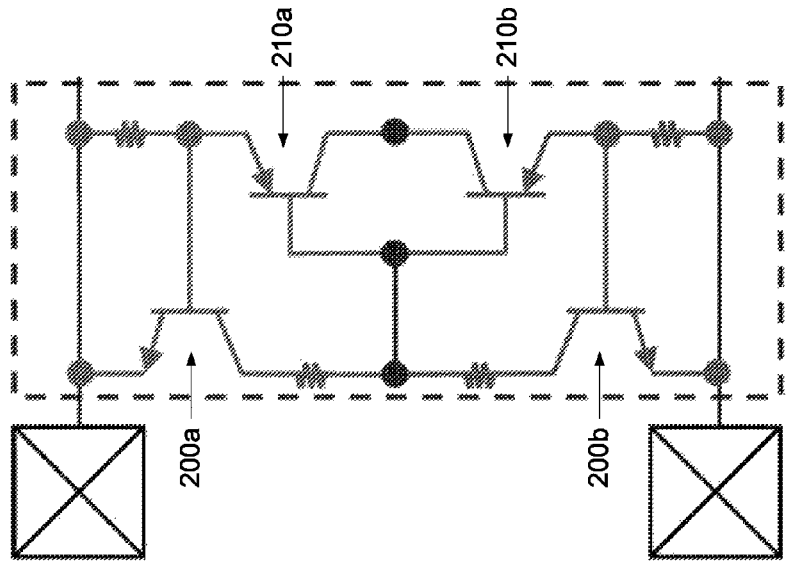
FIG. 2a illustrates a simplified diagram of an embodiment of the present invention.
Figure 1:
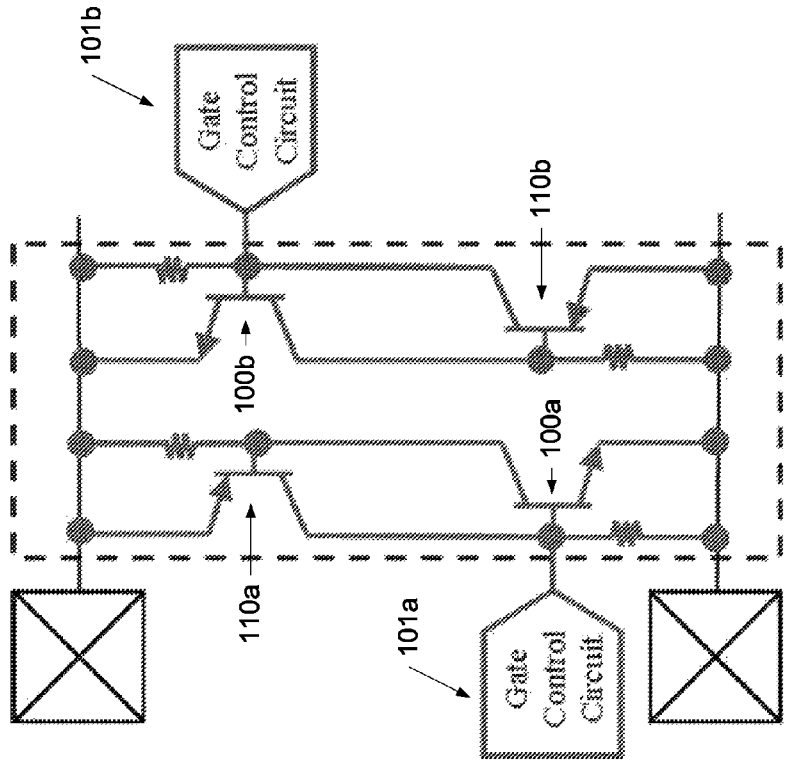
FIG. 1 illustrates a simplified diagram of a prior art and 1b respectively illustrate a simplified diagram of a prior art TRIAC.

Example embodiments may also, for example, eliminate the need for the gate control circuits required by conventional TRIACs. Example embodiments may, for example, be useful in motor driver circuits, such as connected between an I/O pad and power pad. In this case, example embodiments may provide positive and negative high voltage ESD protection without causing irregularities during normal operation and without introducing latch-up issues. Example embodiments may also, for example, be used for system level surge voltage protection, such as on a chip. Example embodiments may also be fabricated, in some cases, with a standard BCD process that does not require the addition of an increased number of masks or processes. The polysilicon used in some example embodiments may, for example, be provided via a hard mask at ion implantation FIG. 1 illustrates a simplified circuit diagram representations of a conventional TRIAC. As shown, a conventional TRIAC may consist of a two NPN BJTs 100a, 100b; two PNP BJTs 110a, 110b; and two gate control circuits 101a, 101b, arranged as depicted in the figure. In comparison, FIG. 2a illustrates a simplified circuit diagram representation of an embodiment of the present invention. As can be seen in FIG. 2a, the embodiment of the present invention may consist of two NPN BJTs 200a, 200b and two PNP BJTs 210a, 210b, arranged as depicted in the figure. The NPN and PNP BJTs may, for example, be high voltage NPN and PNP BJTs. As shown, embodiments of the present invention may eliminate the need for the gate control circuits required by the conventional TRIAC depicted in FIG. 1. Thus, embodiments of the present invention may provide substantial footprint and complexity reduction benefits, by eliminating the need for the relatively large and complicated gate control circuits of convention TRIACs.

Figure 2C:
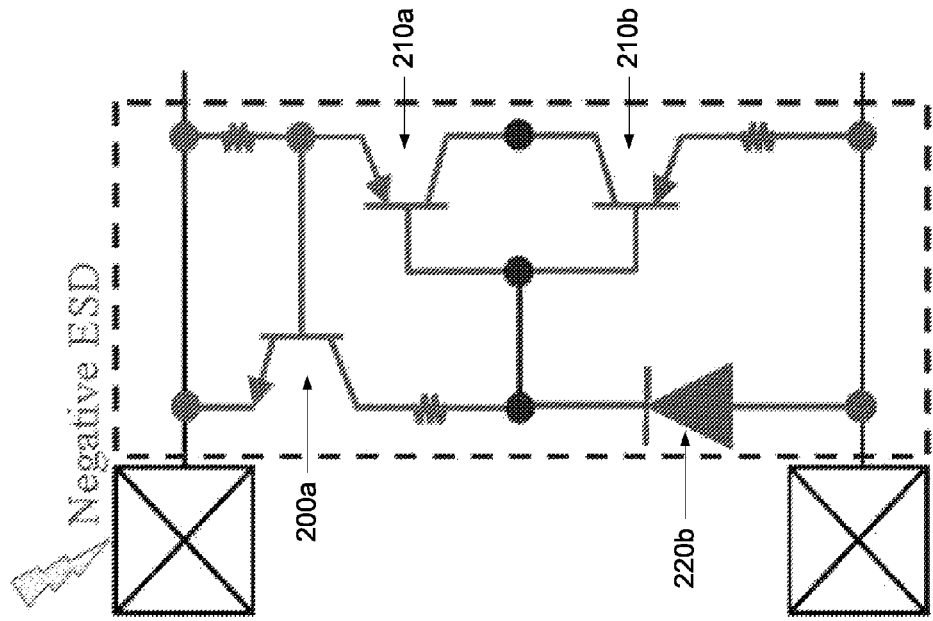
FIGS. 2b and 2c illustrate simplified diagrams of an embodiment of the present invention under positive and negative ESD stress, respectively.
Figure 2B:
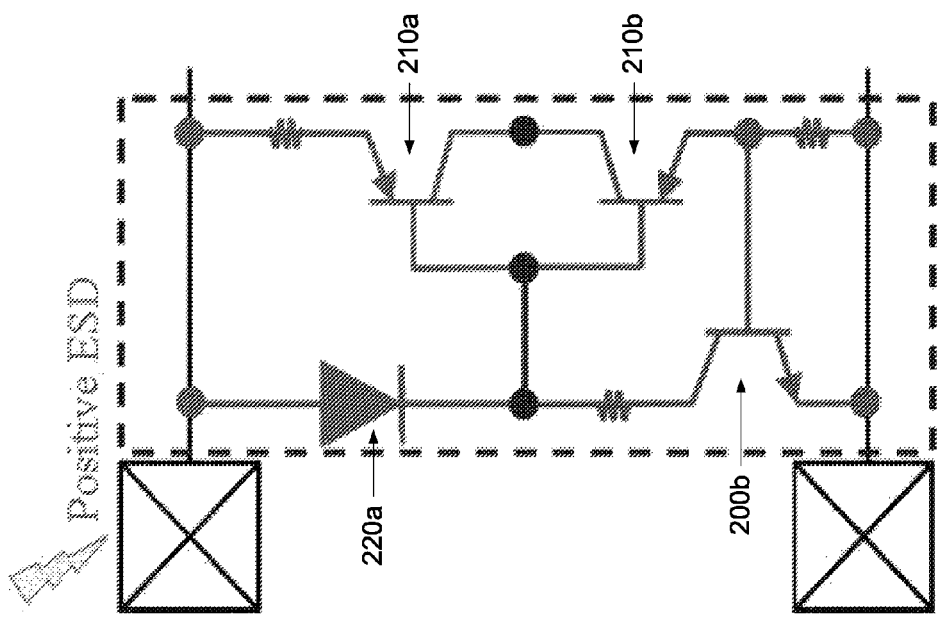

FIGS. 2b and 2c respectively illustrate the electrical properties of an example embodiment of the present invention under positive and negative ESD stress. As can be seen in FIG. 2b, the top NPN BJT transistor 200a operates as a forward bias diode 220a under positive ESD stress. As can be seen in FIG. 2c, under negative ESD stress the bottom NPN BJT transistor 200b operates as a forward bias diode 220b. Thus, whether positive or negative ESD stress is applied, embodiments of the present invention may ensure ESD current is discharged, thus providing bi-directional ESD protection. The forward and reverse breakdown voltages of example embodiments may be made the same or different by using thyristors having the same or different breakdown voltages.

Figure 6A:
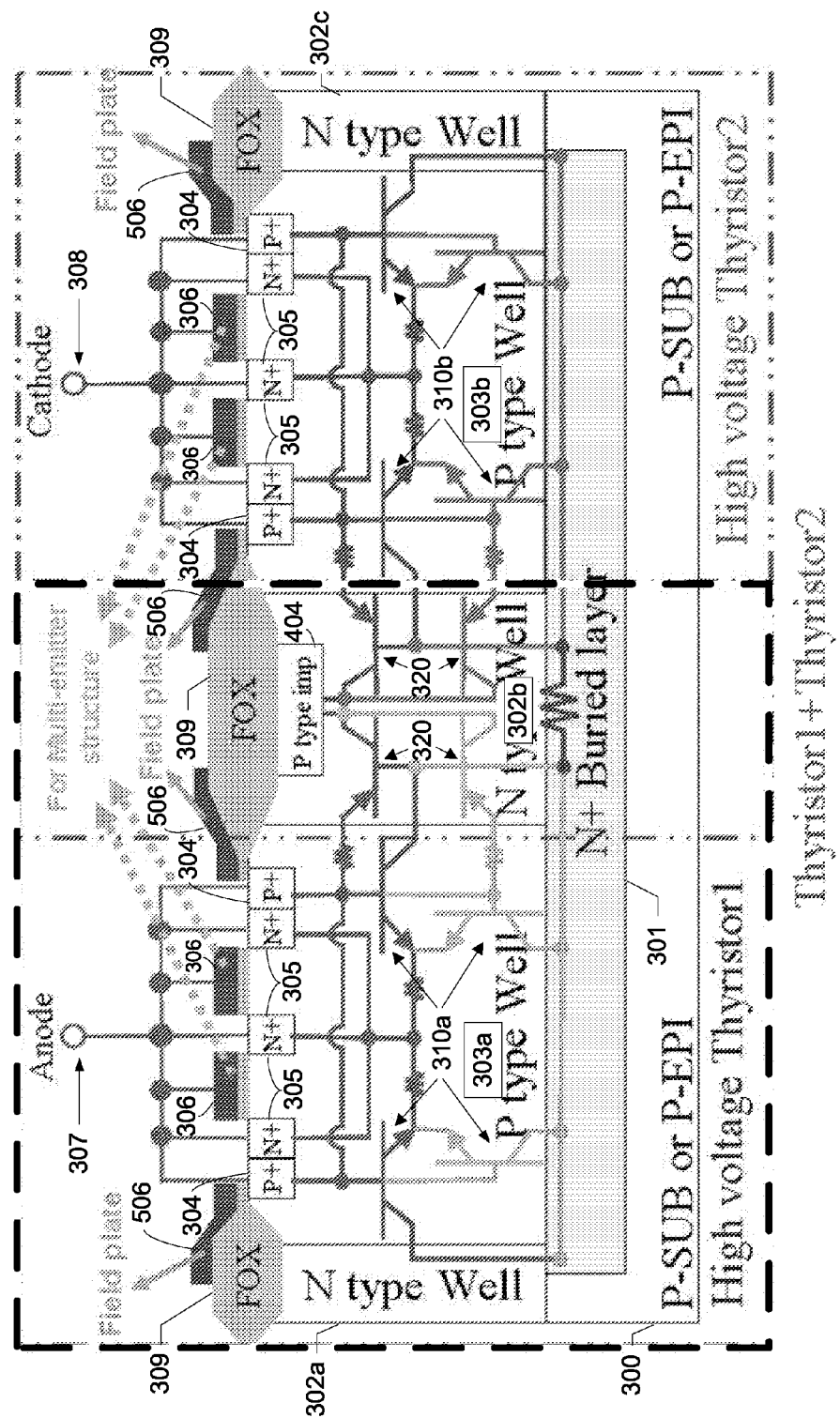
FIG. 6a illustrates a cross-sectional view of the structure of an example embodiment.
Figure 6B:
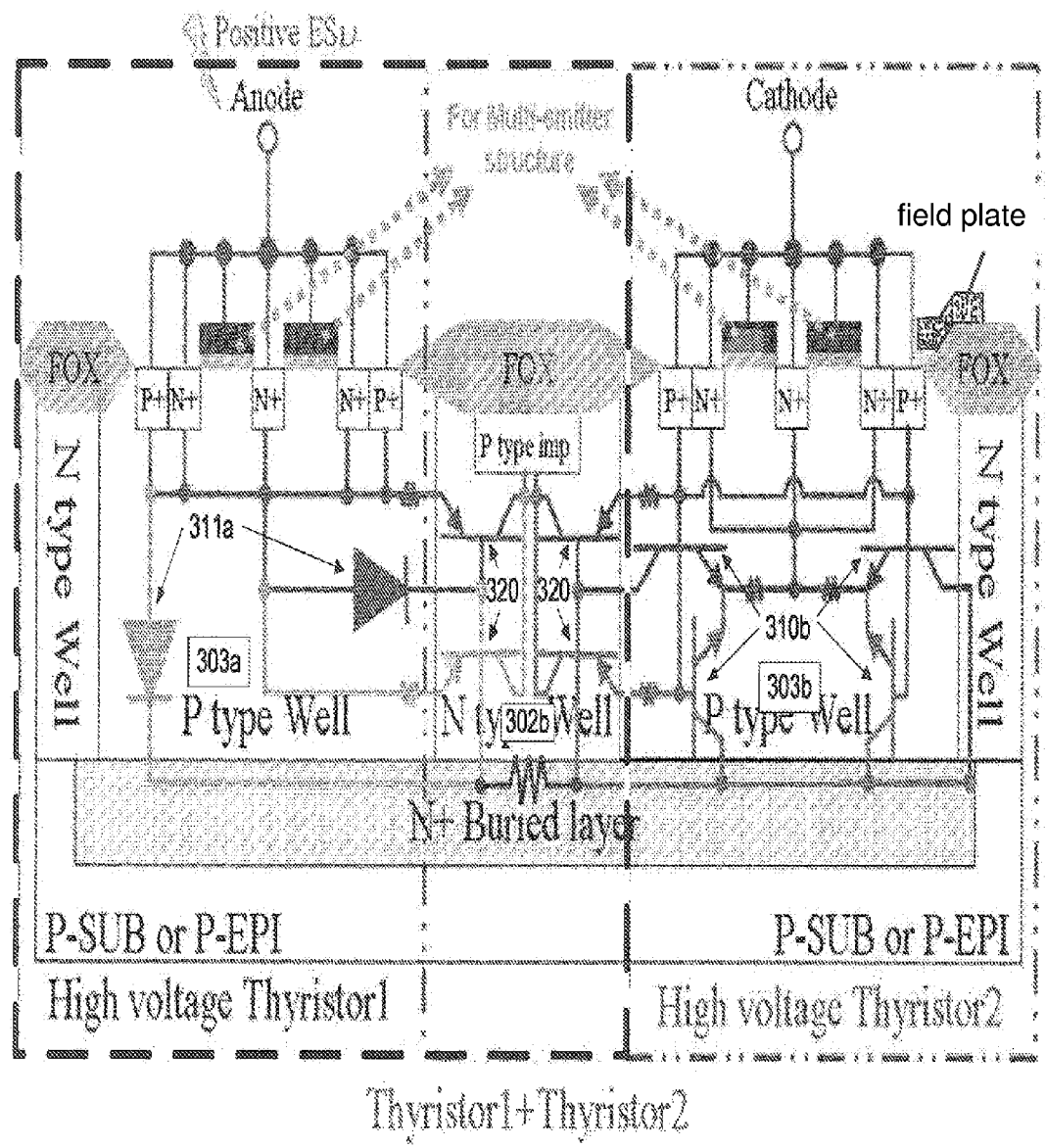
FIGS. 6b and 6c illustrate cross-sectional views of the structure of the example embodiment under positive and negative ESD stress, respectively.
Figure 6C:
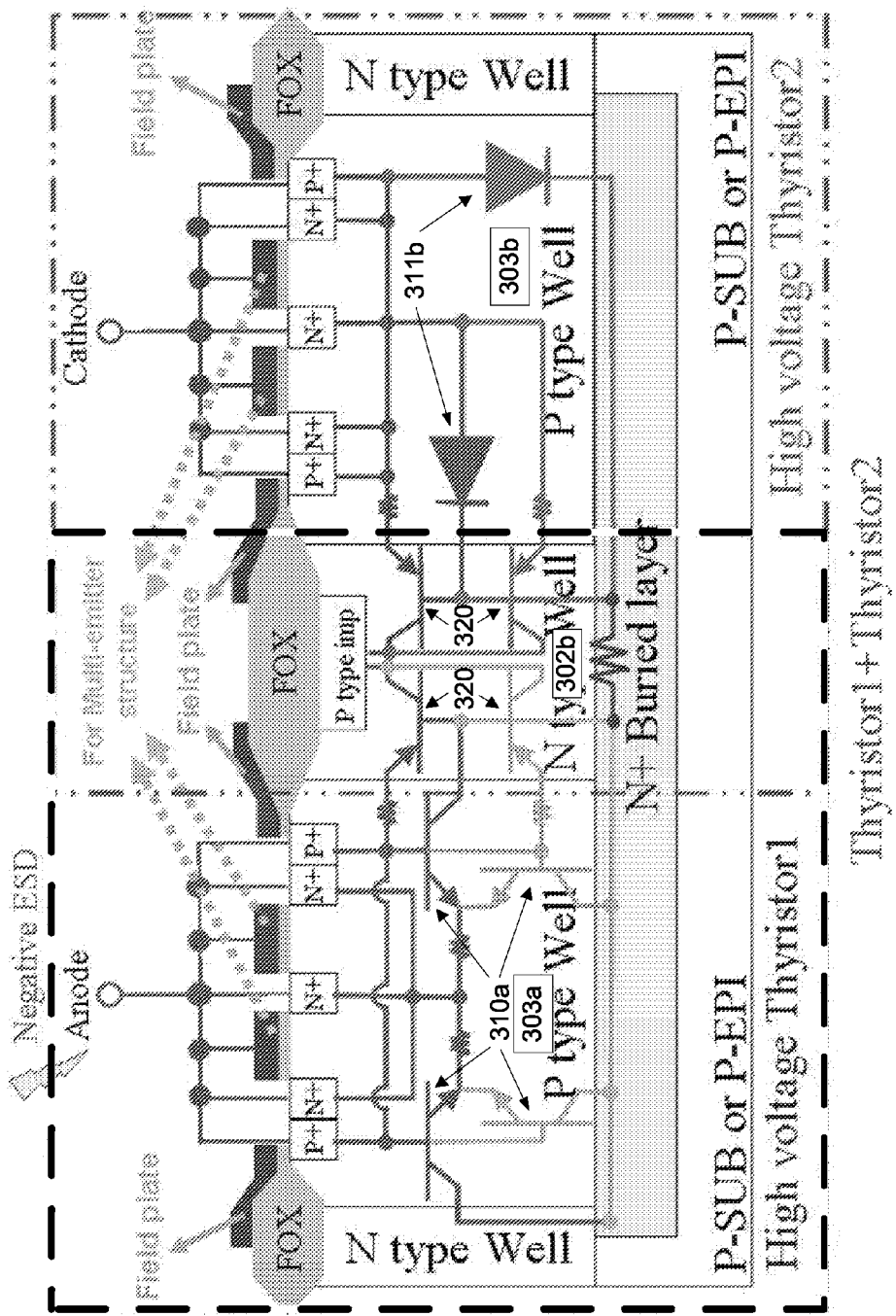
Figure 7:
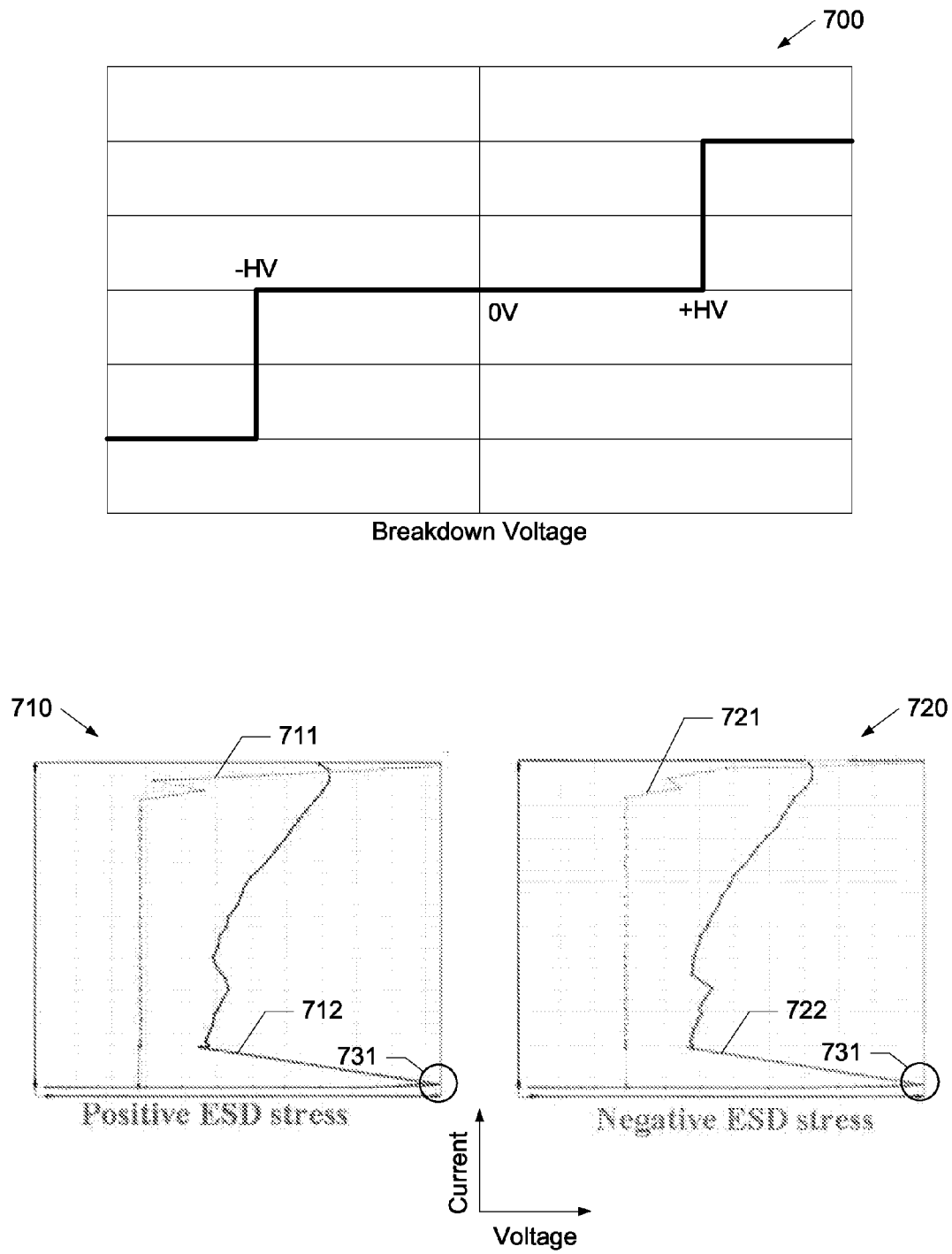
FIG. 7 illustrates breakdown voltage characteristics and experimental electrical characteristics of an example embodiment.

Having thus described generally the electrical characteristics and properties of example embodiments of the present invention, reference will now be directed to FIGS. 6 through 8 in order to describe the structure of an example embodiment.

Figure 3A:
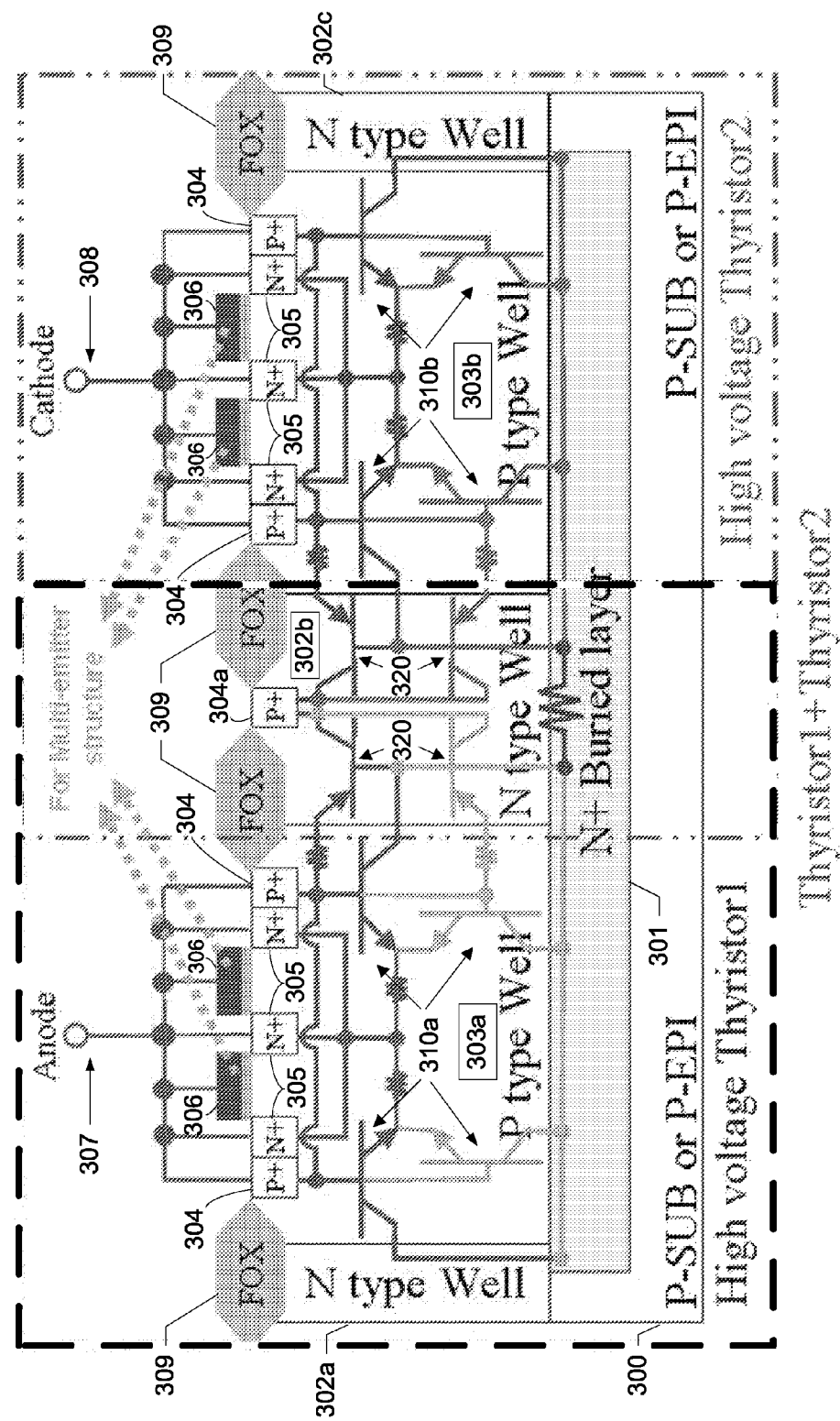
FIG. 3a illustrates a cross-sectional view of the structure of an example embodiment.

FIG. 3a illustrates a cross-sectional view of a first example embodiment of a TRIAC for high voltage electrostatic discharge (ESD) protection. As can be seen from FIG. 3a, a P-type material substrate 300 or an epitaxially-grown P-layer (P-epi) may be provided with an N+ buried layer 301 disposed adjacent thereto. An N-type well 302a-c may be disposed adjacent to the N+ buried layer 301 and encompassing first and second P-type wells 303a, 303b such that a portion 302b of the N-type well is interposed between the first and second P-type wells 303a, 303b. The N-type well 302a-c may be a single contiguous well according to some embodiments or, according to another embodiment, may comprise two or more separate N-type wells. The outer portions of the N-type well 302a, 302c may be in contact with the P-type substrate 300 according to an example embodiment. The first and second P-type wells 303a, 303b may comprise at least one P+ doped plate 304 and at least one N+ doped plate 305. The portion of the N-type well 302b which is interposed between the first and second P-type wells 303a, 303b may comprise at least one P-type portion 304a.

For example, according to the example embodiment depicted in FIG. 3a, the first and second P-type wells 303a, 303b may each comprise two P+ doped plates 304, three N+ doped plates 305, and two gate structures 306. Thus, as shown, the first P-type well 303a may comprise a first P+ doped plate 304 that may be disposed adjacent to a first N+ doped plate 305, a first gate structure 306 that may be interposed between the first and a second N+ doped plate 305, a second gate structure 306 that may be interposed between the second and a third N+ doped plate 305, and a second P+ doped plate 304 that may be disposed adjacent to a third N+ doped plate 305. Similarly, the second P-type well 303b may comprise a third P+ doped plate 304 that is disposed adjacent to a fourth N+ doped plate 305, a third gate structure 306 that is interposed between the fourth and a fifth N+ doped plate 305, a fourth gate structure that is interposed between the fifth and a sixth N+ doped plate 305, and a fourth P+ doped plate 304 that is disposed adjacent to the sixth N+ doped plate 305. The portion of the N-type well 302b which is interposed between the first and second P-type wells 303a, 303b may comprise a P+ doped plate 304a. According to another example embodiment, an anode 307 may be operably connected to the P+ doped plates 304, N+ doped plates 305, and gate structures 306 of one of the P-type wells 303a, and a cathode 308 may be operably connected to the P+ doped plates 304, N+ doped plates 305, and gate structures 306 of the other of the P-type wells 303b.

The gate structures 306 which may be formed between the N+ doped plates 305 may include a gate oxide layer and a layer of polysilicon, where the polysilicon may, for example, be provided as a hard mask at ion implantation. The gate structures 306 may enable collective operation of the distributed N+ doped plates 305. Field-oxide film (FOX) portions 309 may be disposed adjacent to the surface of portions of the N-type well 302a-c and adjacent a distal end of each of the P+ doped plates 304.

Figure 3B:
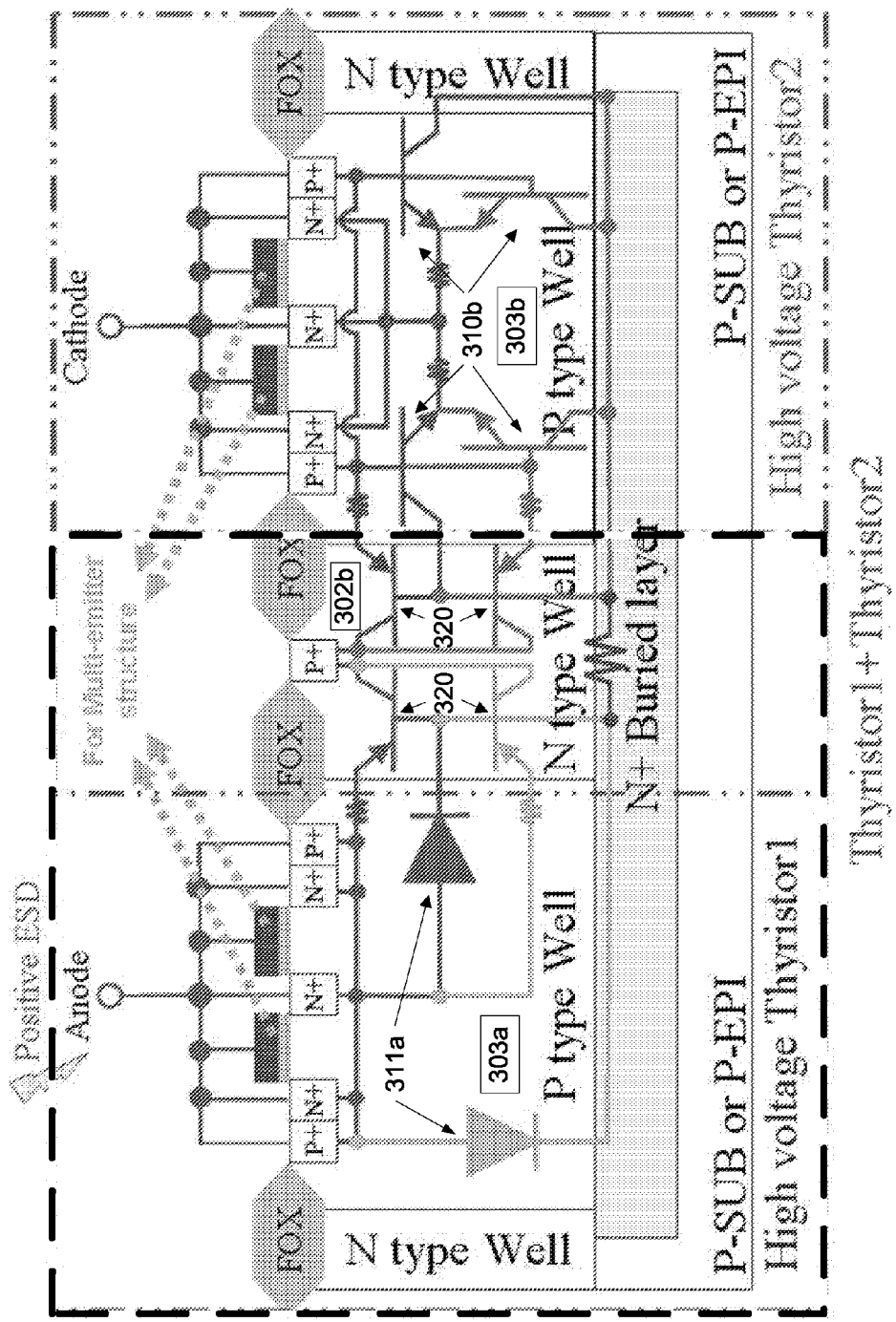
FIGS. 3b and 3c illustrate cross-sectional views of the structure of the example embodiment under positive and negative ESD stress, respectively.
Figure 3C:
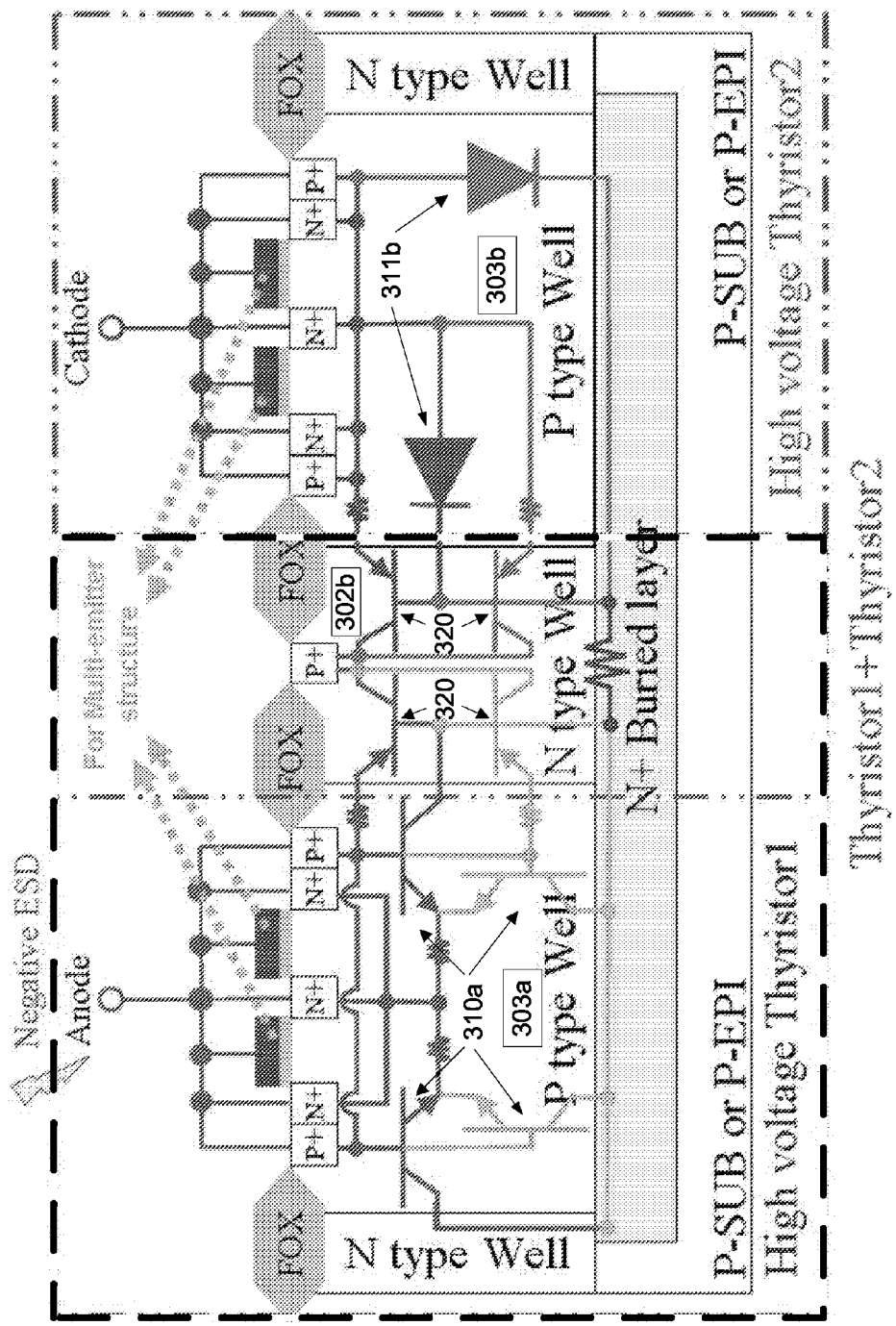

As can be seen from FIGS. 3a-c, multiple NPN BJT transistors 310a, 310b (in this example there are eight, four anode-side 310a and four cathode-side 310b) and multiple PNP BJT transistors 320 (in this example there are four) may be effectively formed and arranged as depicted by the provided structure. As shown in FIG. 3b, during a positive ESD event the anode-side transistors 310a may, in effect, operate as forward bias diodes 311a. As shown in FIG. 3c, during a negative ESD event the cathode-side transistors 311b may, in effect, operate as forward bias diodes 311b. Thus, during either a positive or negative ESD event, ESD current may be discharged by a forward bias diode and a thyristor at the same time.

Figure 4A:
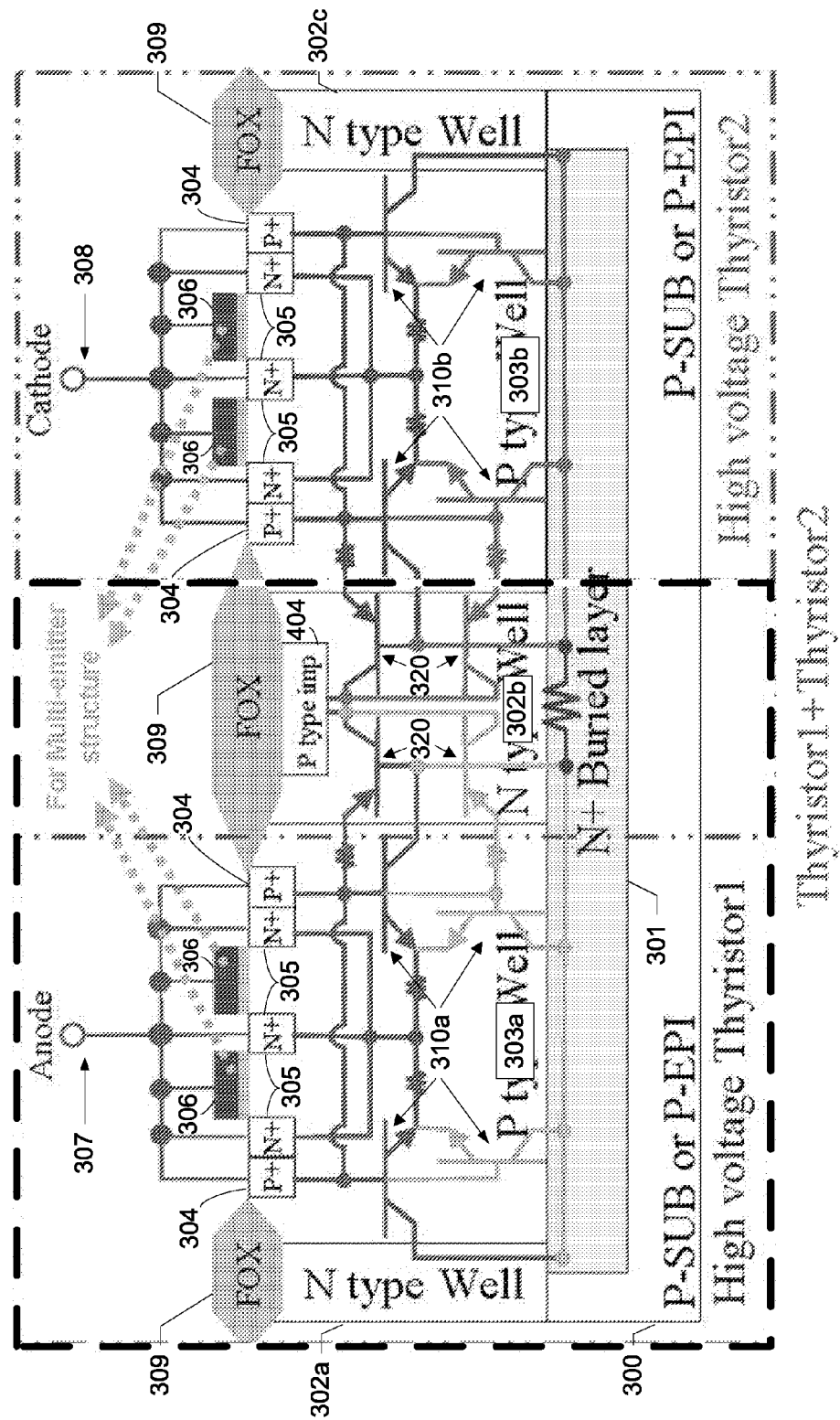
FIG. 4a illustrates a cross-sectional view of the structure of an example embodiment.
Figure 4B:
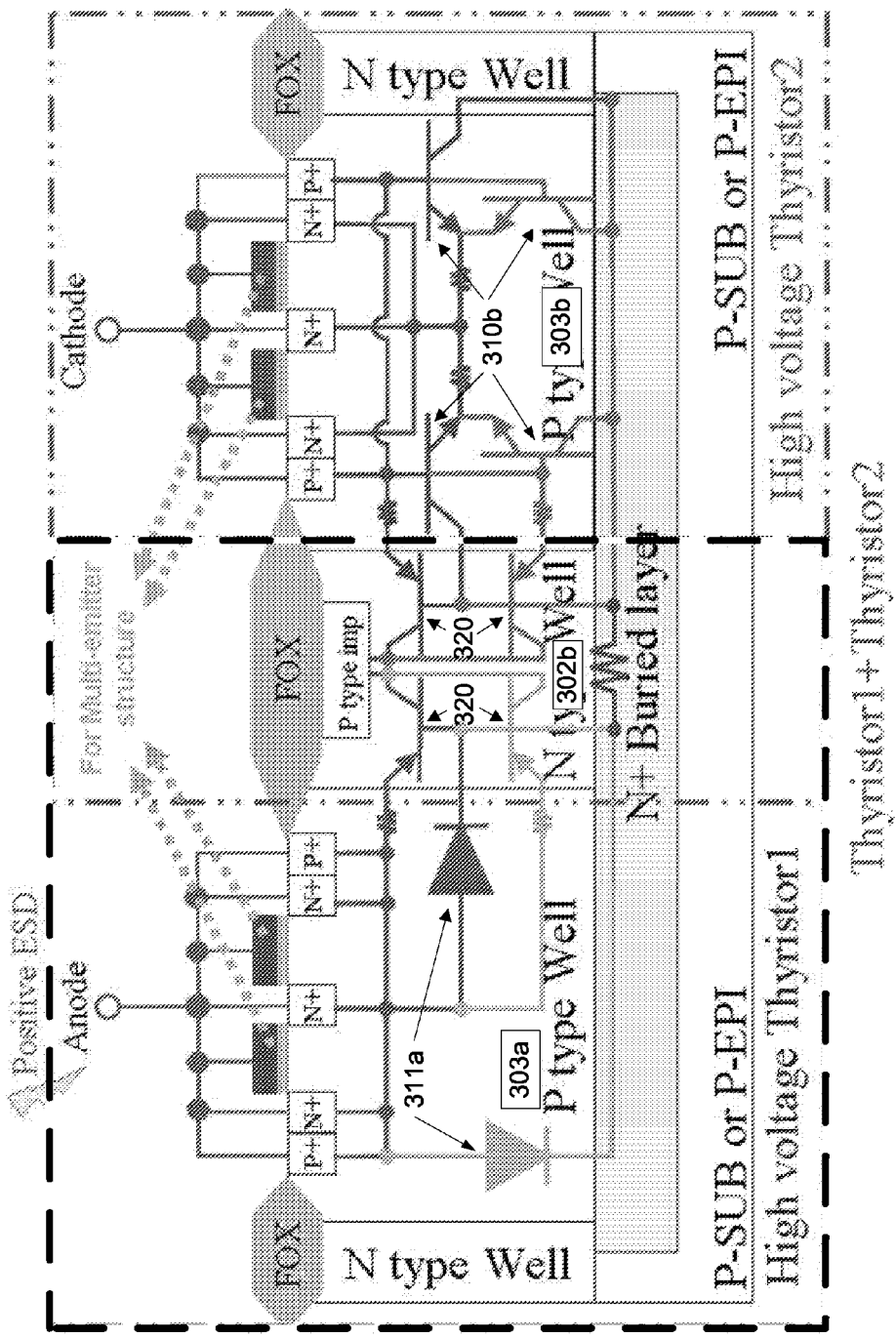
FIGS. 4b and 4c illustrate cross-sectional views of the structure of the example embodiment under positive and negative ESD stress, respectively.
Figure 4C:
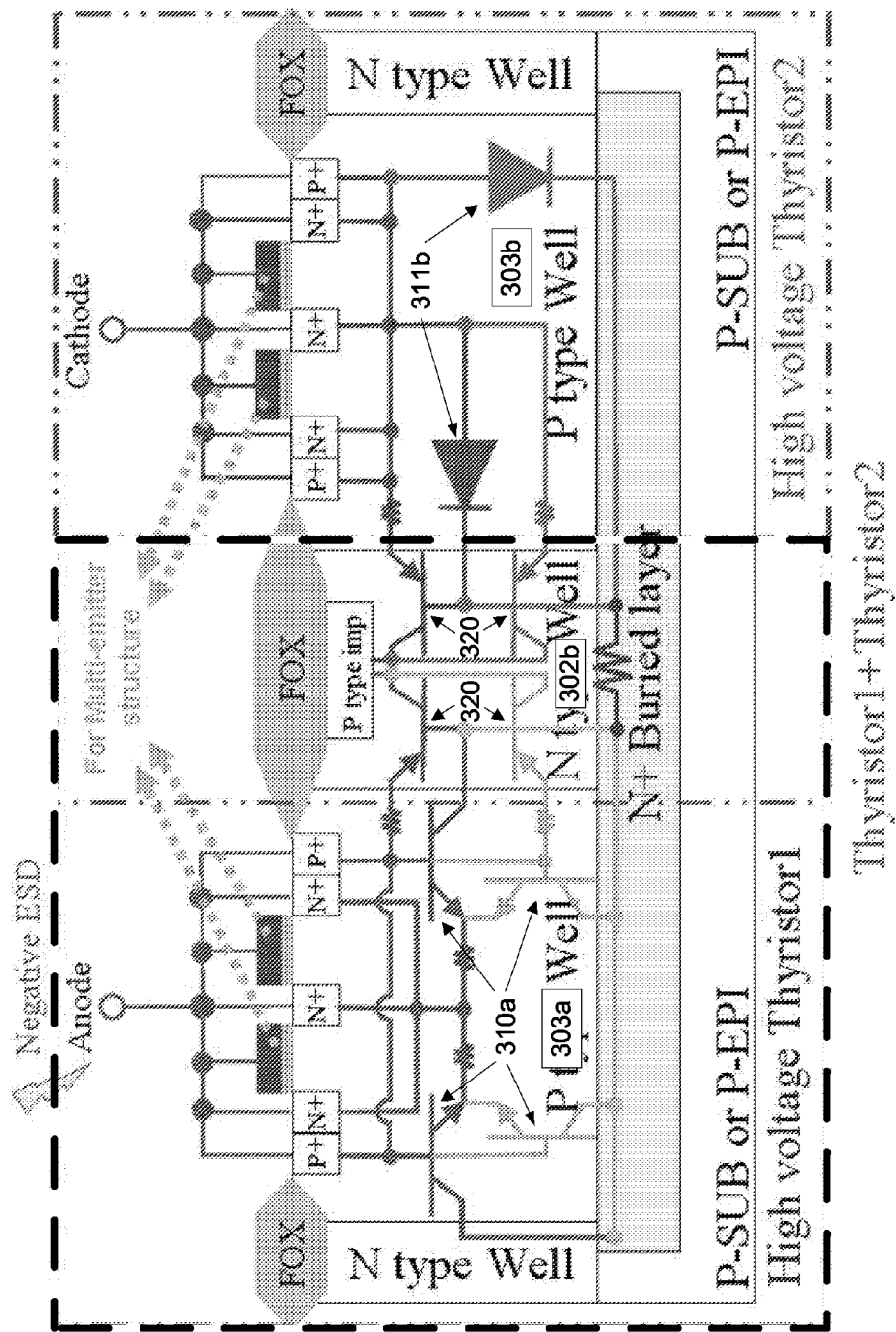

FIG. 4a illustrates a cross-sectional view of a second example embodiment of a TRIAC for high voltage ESD protection. As can be seen from FIG. 4a, the second embodiment is similar to the first, as depicted in FIG. 3a and described above, except that the P-type portion 404 disposed adjacent to the portion of the N-type well 302b which is interposed between the first and second P-type wells 303a, 303b comprises a P-type implant, instead of a P+ doped plate. As can be seen from FIGS. 4b and 4c, the behavior of the second embodiment during positive and negative ESD events remains similar, with the anode-side transistors 310a operating as forward bias diodes 311a during a positive ESD event and the cathode-side transistors 311b operating as forward bias diodes 311b during a negative ESD event.

Figure 5A:
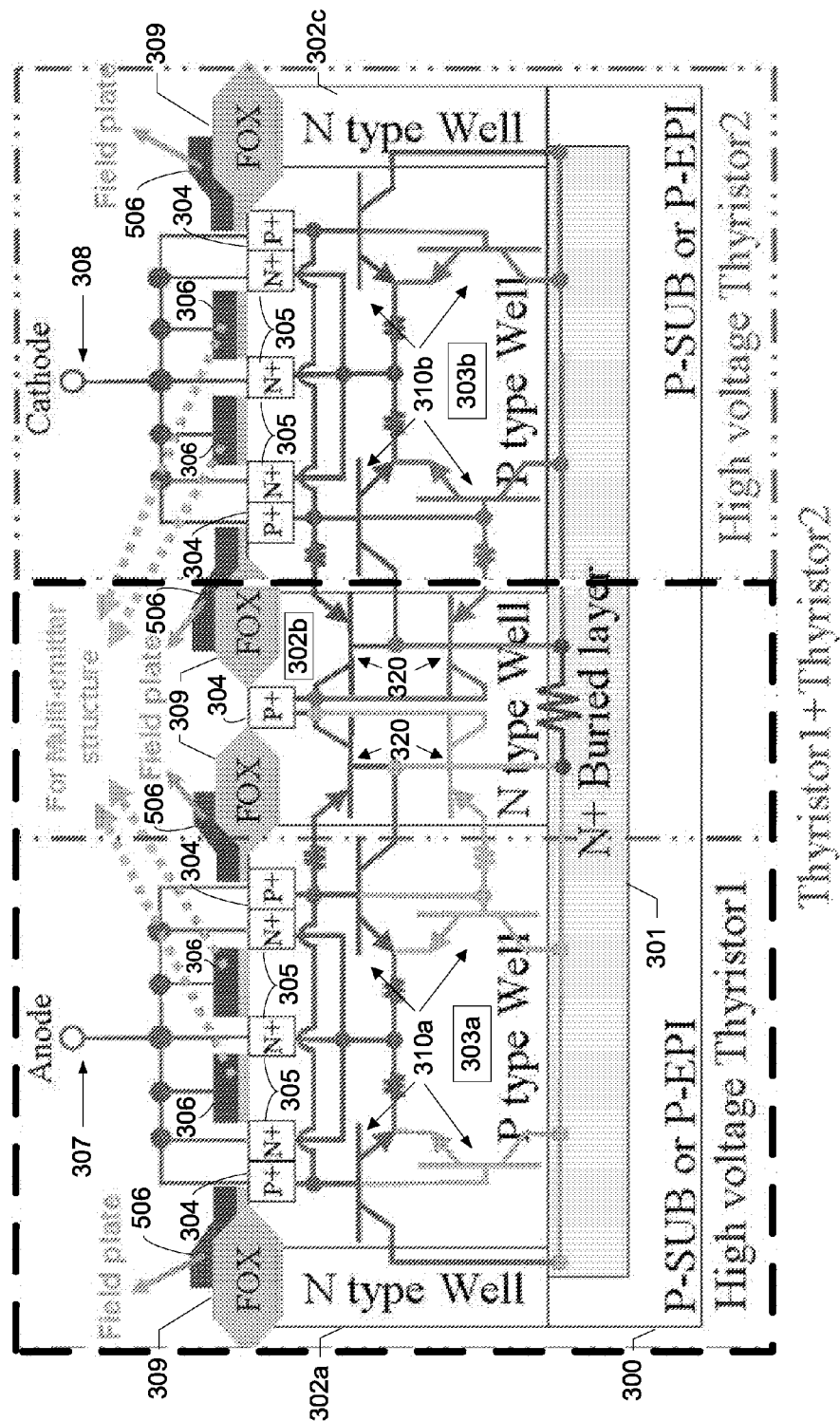
FIG. 5a illustrates a cross-sectional view of the structure of an example embodiment.
Figure 5B:
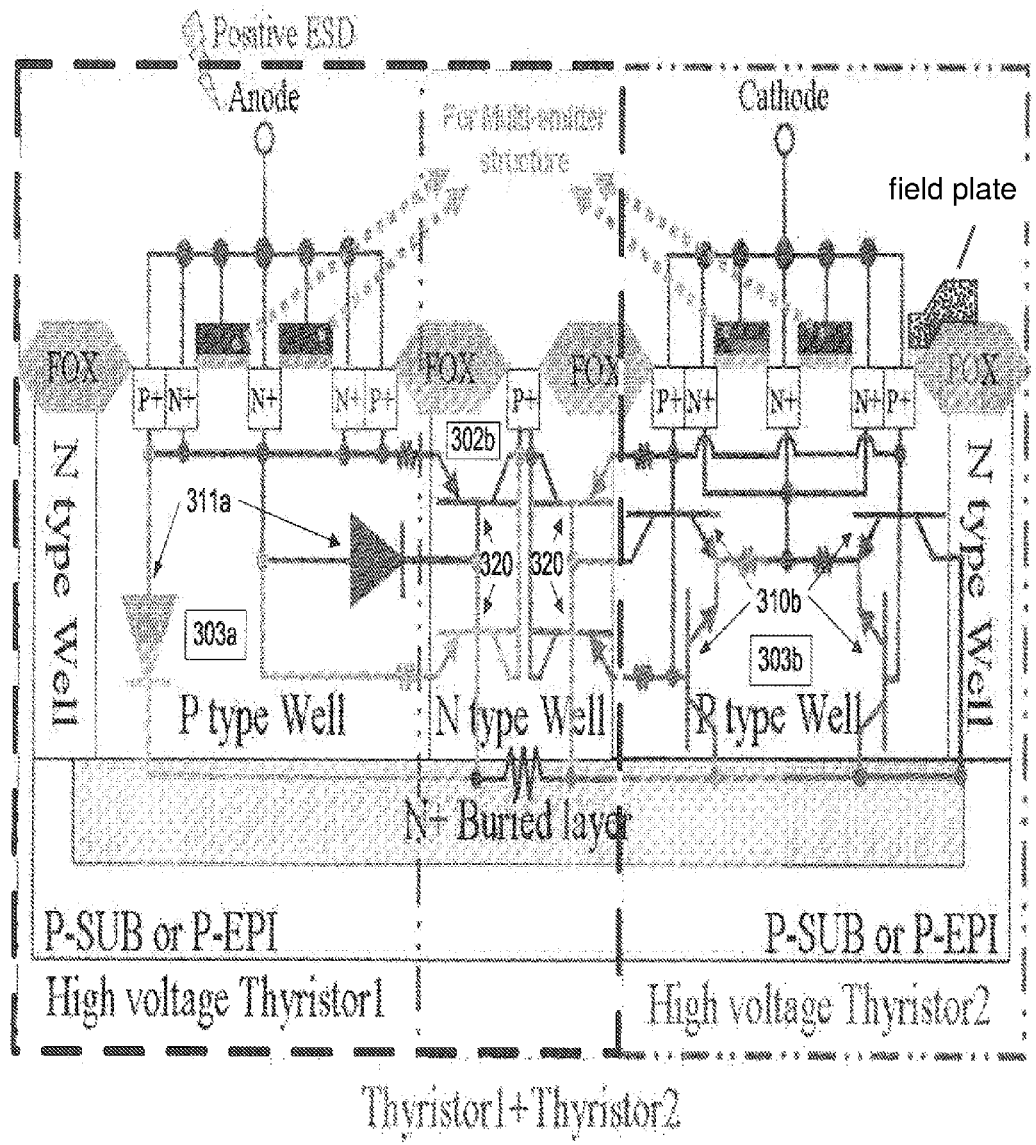
FIGS. 5b and 5c illustrate cross-sectional views of the structure of the example embodiment under positive and negative ESD stress, respectively.
Figure 5C:
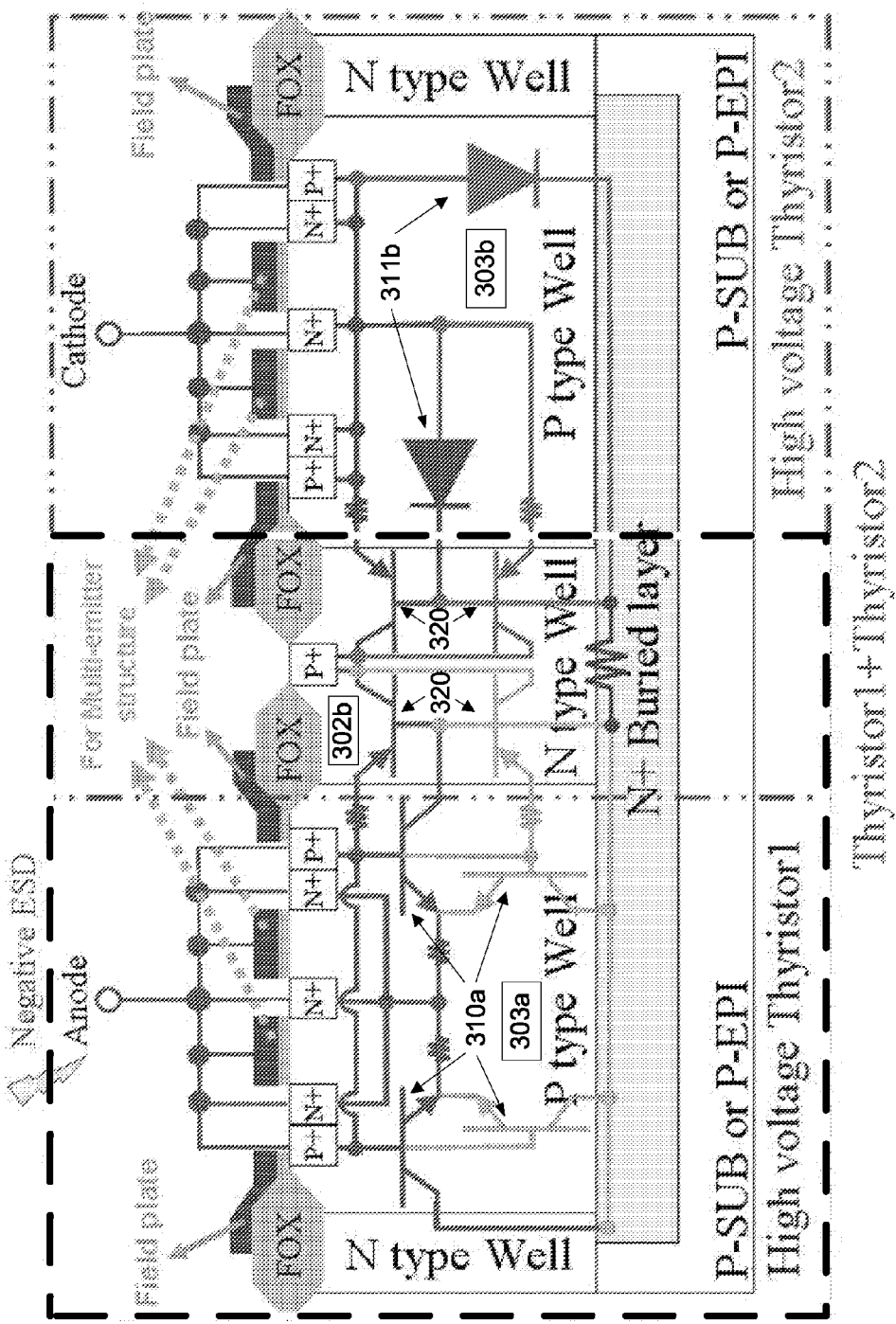

FIG. 5a illustrates a cross-sectional view of a third example embodiment of a TRIAC for high voltage ESD protection. As can be seen from FIG. 5a, the third embodiment is similar to the first, as depicted in FIG. 3a and described above, in that the P-type portion 304a disposed adjacent to the portion of the N-type well 302b which is interposed between the first and second P-type wells 303a, 303b comprises a P+ doped plate. However, the third example embodiment, unlike the first, further comprises field plates 506 disposed adjacent to the FOX portions 309. As previously mentioned, breakdown and trigger voltages of the TRIAC may be adjusted by manipulating the width of these field plates 506 during manufacturing. As can be seen from FIGS. 5b and 5c, the behavior of the third example embodiment during positive and negative ESD events remains similar to the first and second embodiments, with the anode-side transistors 310a operating as forward bias diodes 311a during a positive ESD event and the cathode-side transistors 311b operating as forward bias diodes 311b during a negative ESD event.

FIG. 6a illustrates a cross-sectional view of a fourth example embodiment of a TRIAC for high voltage ESD protection. As can be seen from FIG. 6a, the fourth embodiment is similar to the second, as depicted in FIG. 4a and described above, in that the P-type portion 404 disposed adjacent to the portion of the N-type well 302b which is interposed between the first and second P-type wells 303a, 303b comprises a P-type implant, instead of a P+ doped plate. However, the fourth example embodiment, like the third, also includes field plates 506 disposed adjacent to the FOX portions 309. As can be seen from FIGS. 6b and 6c, the behavior of the fourth example embodiment during positive and negative ESD events remains similar to the first, second, and third, with the anode-side transistors 310a operating as forward bias diodes 311a during a positive ESD event and the cathode-side transistors 311b operating as forward bias diodes 311b during a negative ESD event.

It will be understood that the configurations depicted in FIGS. 3a-6c and, indeed, configurations according to other embodiments which are not depicted, may represent two thyristors, e.g., a forward and reverse high voltage thyristor, which have been merged into one device, such that the thyristors share a common N-type well region 302b. Thus, embodiments of the present invention may share a common N-type region 302b. That is, the substrate 300; the N+ buried layer 301; the portions of the N-the type well 302a, 302b; the P-type portion the first P-type well 303a, along with the P+ plates 304, N+ plates 305, and gate structures 306 associated with the first P-type well 303a, may function as a first high voltage thyristor. Likewise, the substrate 300, the N+ buried layer 301, portions of the N-the type well 302c, 302b, the second P-type well 303b, along with the P+ plates 304, N+ plates 305, and gate structures 306 associated with the second P-type well 303b, may function as a second high voltage thyristor. The portion of the N-type well 302b which is interposed between the first 303a and second 303b P-type regions may thus comprise the common N-type region. It will be understood that this configuration results in a device with electrical properties which are comparable to two thyristors, e.g., a forward and reverse high voltage thyristor, that have been connected in series.

Having thus described a number of example embodiments of a TRIAC for high voltage ESD protection, various methods and materials which may be used in the manufacturing of various embodiments will now be described. In this regard, the material of the N+ buried layer 601 may be N-epi, a deep N-type well, or multiple, stacked N+ buried layers. The P-type wells 603a, 603b may be stacked with a P-type well and P+ buried layer or a P-implant. The N-type wells 602a-c may also be an N-implant in some cases. Example embodiments may be fabricated using any standard BCD process without additional masks. Example embodiments may also or alternatively be fabricated with a non-epitaxial process, such as a triple well process, or with a single poly or double poly process. A local oxidation of silicone (LOCOS) process may be used in the fabrication of at least a portion of the structure, such as to fabricate the FOX portions 309. Alternatively, a shallow trench isolation (STI) process may be used, such as to fabricate at least a portion of the structure, such as the FOX portions 309. The field plates 506 may be poly, or metal, or multiple poly and metal stacked. With respect to example embodiments 1 and 3 respectively depicted in FIGS. 3a and 5a, the P+ doped plate disposed adjacent to the common N-type well region 302b may, for example, be manufactured via a diffusion process, such as through the opening between the adjacent FOX portions 309. Thus, the P+ doped plate may be manufactured by diffusing a heavily P+ doped material into the N-type material of the common N-type well region 302b. With respect to example embodiments 2 and 4 respectively depicted in FIGS. 4a and 6a, the P-type implant may comprise any type of P-type carrier, such as, for example, P– or P+. The P-type implant 404 may, for example, be implanted through the FOX 309, or may be implanted before the FOX 309 is fabricated. The depth of the P-type implant may, for example, correspond with the depths of the N and/or P-type wells. As noted above, various adjustments may be made to alter the electrical properties of example embodiments. For example breakdown and trigger voltage may be adjusted by adjusting the length of the poly field plates 506 disposed adjacent to the FOX portions 309. Holding voltage may also be adjusted by adjusting the width of the N-type well 302a-c. In addition, when implemented in a circuit, early turn-on may be achieved by applying an additional bias at one or more of the gates 306 or the ply of the multi-emitter structure.

FIG. 7 includes a topmost graph 700 illustrating the breakdown voltage characteristics of an example embodiment. As can be seen from the graph 700, the breakdown voltage may have an equal magnitude in the forward (positive) and reverse (negative) direction. The bottom graphs 710, 720 illustrate measured leakage current 711, 721 between the anode 307 and cathode 308, and measured ESD current 712, 722 of an example embodiment during positive and negative ESD stress experiments, respectively. As can be seen, both of the measured ESD currents 712, 722 exhibit snap-back 731, indicating successful triggering of the respective thyristor, and therefore successful ESD protection, in both the positive and negative direction.

Example embodiments may therefore provide a relatively small-sized TRIAC for high voltage electrostatic discharge (ESD) protection, without the need for gate control circuits associated with conventional TRIACs. Moreover, example embodiments may be applied to a standard BCD process without requiring the use of additional masks. Embodiments may also be applied to different high voltage BCD processes and provide different operational voltage related ESD protection in the same process by providing a N+ buried layer or N-type well recipe. As such, high voltage ESD protection that is often required for devices that are to be used in high voltage settings that may encounter ESD events can be provided in a relatively small size. Some embodiments could also be used for system level surge voltage protection on a chip, or even for general DC circuit operation. Additionally, ESD protection may be provided for devices which require such protection to be bi-directional, such as in motor driver circuits. In this regard, embodiments may, for example, be operably connected between an input/output (I/O) pad and a power pad of the motor driver circuit so as to provide positive and negative high voltage ESD protection without causing irregular operation or inducing latch-up issues.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A semiconductor device comprising:
   a p-type substrate;
   an N+ doped buried layer disposed adjacent to the substrate;
   a first P-type well region disposed adjacent to the N+ doped buried layer;
   a second P-type well region disposed adjacent to the N+ doped buried layer; and
   an N-type well region adjacent to the N+ doped buried layer and encompassing the first and second P-type well regions such that at least a portion of the N-type well region is interposed between the first and second P-type well regions;
   wherein the portion of the N-type well region which is interposed between the first and second P-type well regions comprises a P-type portion;
   wherein the first p-type well comprises first, second, and third N+ doped plates, first and second P+ doped plates, and first and second gate structures, the first P+ doped plate being disposed adjacent to the first N+ doped plate, the first gate structure being interposed between the first and second N+ doped plate, the second gate structure being interposed between the second and third N+ doped plate, and the second P+ doped plate being disposed adjacent to the third N+ doped plate; and further wherein the second p-type well comprises fourth, fifth, and sixth N+ doped plates, third and fourth P+ doped plates, and third and fourth gate structures, the third P+ doped plate being disposed adjacent to the fourth N+ doped plate, the third gate structure being interposed between the fourth and fifth N+ doped plate, the fourth gate structure being interposed between the fifth and sixth N+ doped plate, and the fourth P+ doped plate being disposed adjacent to the sixth N+ doped plate.

2. The semiconductor device of claim 1, wherein the P-type portion comprises a fifth P+ doped plate.

3. The semiconductor device of claim 1, wherein the P-type portion comprises a P-type implant portion.

4. The semiconductor device of claim 1, further comprising first, second, and third field oxide (FOX) portions disposed adjacent to the N-type well region.

5. The semiconductor device of claim 4, wherein the first FOX portion is further disposed adjacent to the first P+ doped plate, the second FOX portion is further disposed adjacent to the P-type portion and interposed between the second and third P+ doped plate, and the third FOX portion is further disposed adjacent to the fourth P+ doped plate.

6. The semiconductor device of claim 4, further comprising a fourth field oxide (FOX) portion disposed adjacent to the N-type well region, wherein the first FOX portion is further disposed adjacent to the first P+ doped plate, the second FOX portion is further interposed between the second and fifth P+ doped plate, the third FOX portion is further disposed adjacent to the P-type portion and the third P+ doped plate, and the fourth FOX portion being further disposed adjacent to the fourth P+ doped plate.

7. The semiconductor device of claim 4, further comprising field plates disposed adjacent to the FOX portions.

8. The semiconductor device of claim 1, wherein the gate structures comprise a polysilicone layer.

9. The semiconductor device of claim 1, wherein the N+ buried layer comprises an n-type epitaxial layer.

10. The semiconductor device of claim 1, wherein the N+ buried layer comprises a deep N-type well.

11. The semiconductor device of claim 1, wherein the N+ buried layer comprises a plurality of stacked N+ buried layers.

12. The semiconductor device of claim 1, wherein each P-type well comprises a stacked P-type well and P+ buried layer.

13. The semiconductor device of claim 1, wherein the P-type wells are fabricated via P-type implantation.

14. The semiconductor device of claim 1, wherein the N-type well region is fabricated via N-type implantation.

15. The semiconductor device of claim 1, wherein a bi-directional BJT is fabricated via a single poly process.

16. The semiconductor device of claim 1, wherein a bi-directional BJT is fabricated via a double poly process.

17. The semiconductor device of claim 1, wherein a bi-directional BJT is fabricated via a non-epitaxial process.

18. A circuit comprising a semiconductor device, the semiconductor device comprising:
a p-type substrate;
an N+ doped buried layer disposed adjacent to the substrate;
a first P-type well region disposed adjacent to the N+ doped buried layer;
a second P-type well region disposed adjacent to the N+ doped buried layer; and
an N-type well region adjacent to the N+ doped buried layer and encompassing the first and second P-type well regions such that at least a portion of the N-type well region is interposed between the first and second P-type well regions;
wherein the portion of the N-type well region which is interposed between the first and second P-type well regions comprises a P-type portion;
wherein the first p-type well comprises first, second, and third N+ doped plates, first and second P+ doped plates, and first and second gate structures, the first P+ doped plate being disposed adjacent to the first N+ doped plate, the first gate structure being interposed between the first and second N+ doped plate, the second gate structure being interposed between the second and third N+ doped plate, and the second P+ doped plate being disposed adjacent to the third N+ doped plate; and
further wherein the second p-type well comprises fourth, fifth, and sixth N+ doped plates, third and fourth P+ doped plates, and third and fourth gate structures, the third P+ doped plate being disposed adjacent to the fourth N+ doped plate, the third gate structure being interposed between the fourth and fifth N+ doped plate, the fourth gate structure being interposed between the fifth and sixth N+ doped plate, and the fourth P+ doped plate being disposed adjacent to the sixth N+ doped plate.

19. The circuit of claim 18, wherein the circuit comprises a motor driver circuit comprising an input/output (I/O) pad and a power pad; and the semiconductor device further comprises:
an anode operably connected to the first, second, and third N+ doped plates, the first and second P+ doped plates, and the first and second gate structures, and
a cathode operably connected to the fourth, fifth, and sixth N+ doped plates, the third and fourth P+ doped plates, and the third and fourth gate structures;
further wherein one of the anode or cathode of the semiconductor device is operably connected to the I/O pad and the other of the anode or cathode of the semiconductor device is operably connected to the power pad.

* * * * *